United States Patent [19]

Bender

[11] Patent Number: 5,514,839
[45] Date of Patent: May 7, 1996

[54] WELDABLE FLEXIBLE CIRCUIT TERMINATION FOR HIGH TEMPERATURE APPLICATIONS

[75] Inventor: Terrence D. Bender, Hamel, Minn.

[73] Assignee: Honeywell Inc., Minneapolis, Minn.

[21] Appl. No.: 386,035

[22] Filed: Feb. 9, 1995

[51] Int. Cl.⁶ .................................................. H05K 1/18
[52] U.S. Cl. ........................ 174/262; 174/261; 174/260; 174/254; 361/776; 361/774; 361/772
[58] Field of Search ........................ 174/262, 266, 174/267, 261, 260, 254; 361/777, 776, 774, 772, 749; 439/67, 77

[56] References Cited

U.S. PATENT DOCUMENTS

| | | |
|---|---|---|
| 3,098,951 | 7/1963 | Ayer et al. . |
| 3,528,173 | 9/1970 | Gall . |
| 3,670,409 | 6/1972 | Reimer ........................................ 29/625 |
| 4,187,388 | 2/1980 | Roberts ...................................... 174/68.5 |
| 4,295,184 | 10/1981 | Roberts ........................................ 361/406 |
| 4,970,624 | 11/1990 | Arneson et al. ............................. 361/398 |
| 5,384,435 | 1/1995 | Fuerst et al. ................................. 174/262 |

*Primary Examiner*—Laura Thomas
*Attorney, Agent, or Firm*—Gregory A. Bruns

[57] ABSTRACT

A termination for a flexible circuit having flat conductive strips integrally bonded to a flexible substrate. The conductive strip has a termination portion located adjacent an aperture in the substrate. The termination portion has a connection tab, with the termination portion and the connection tab lying in a plane. The termination is for connection to a conductive element end which extends through the aperture. The connection tab is formed into a shape outside the plane with the connection tab engaging the conductive element where it is secured by welding to the conductive element.

17 Claims, 3 Drawing Sheets

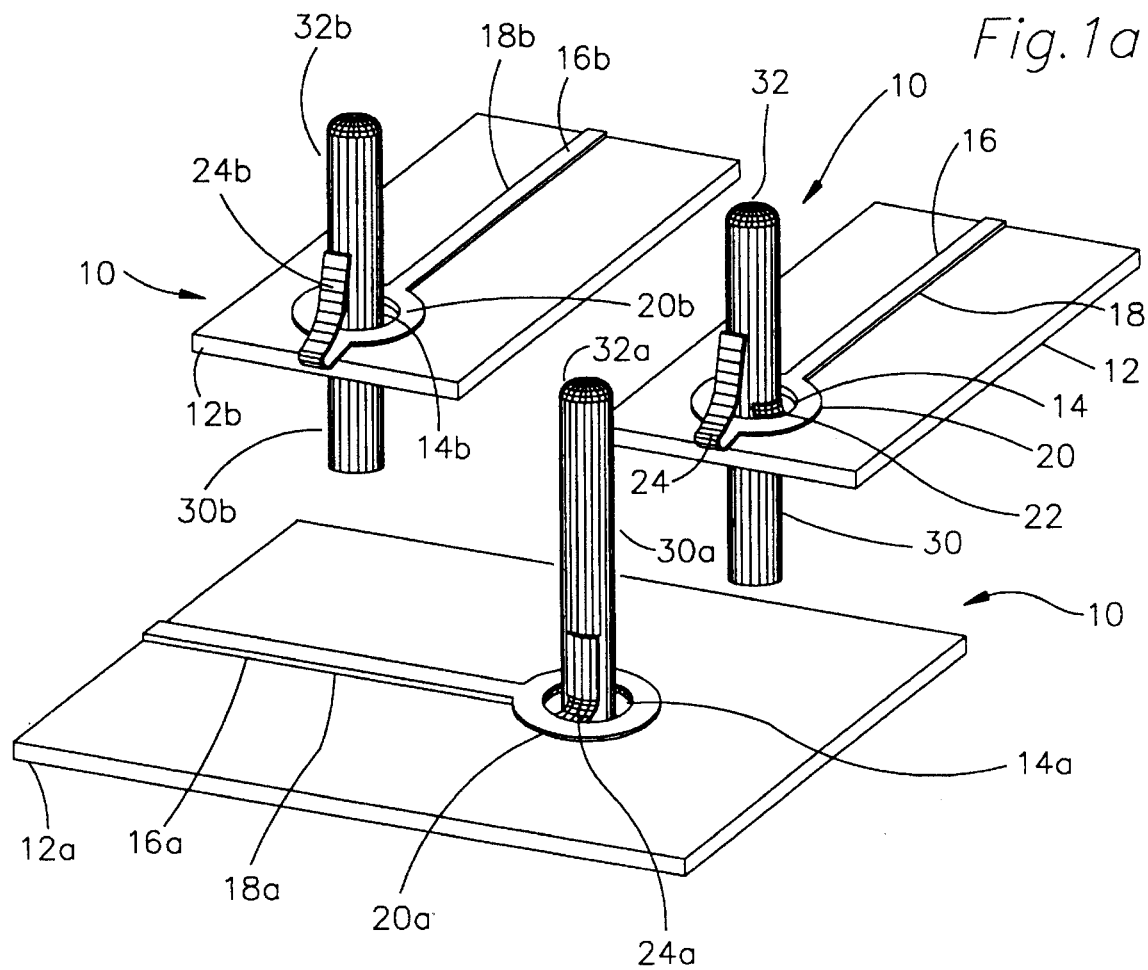

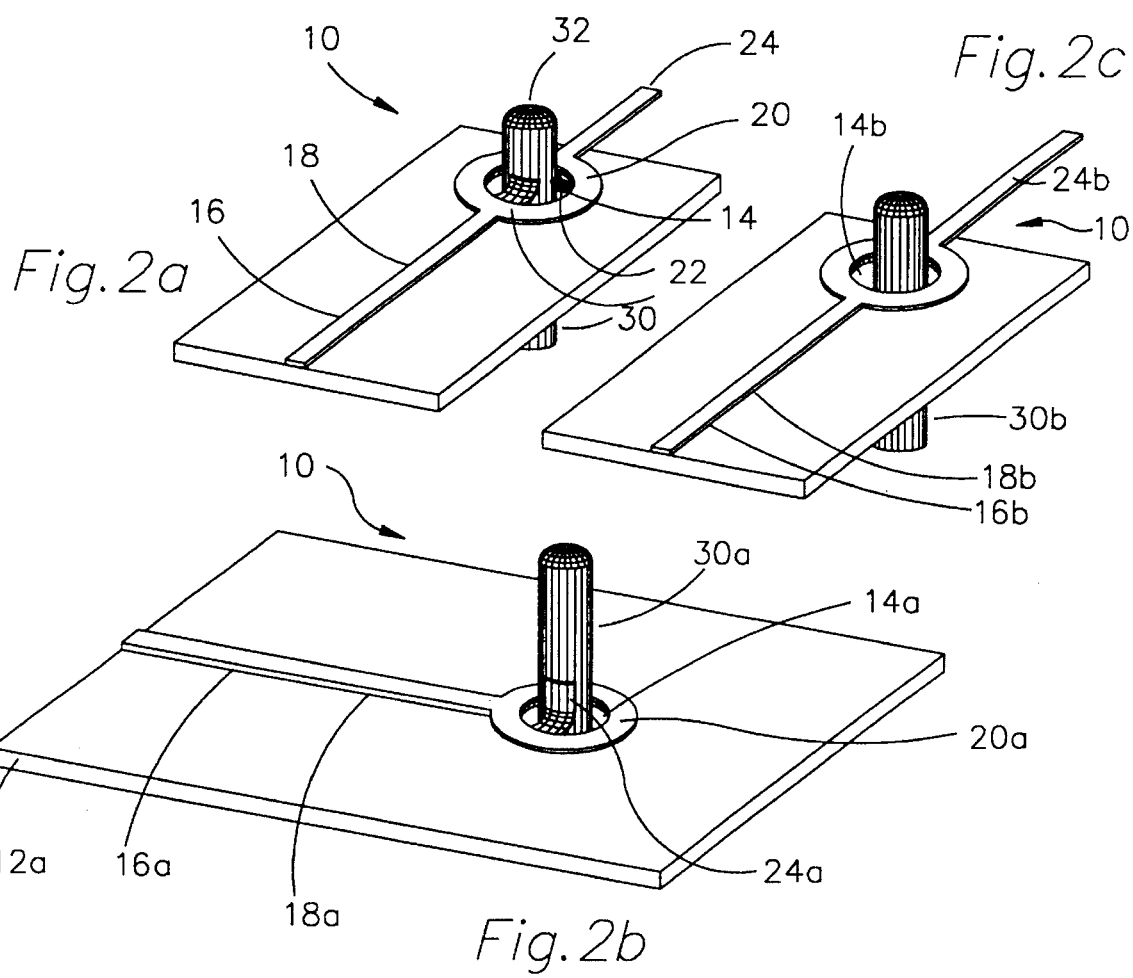

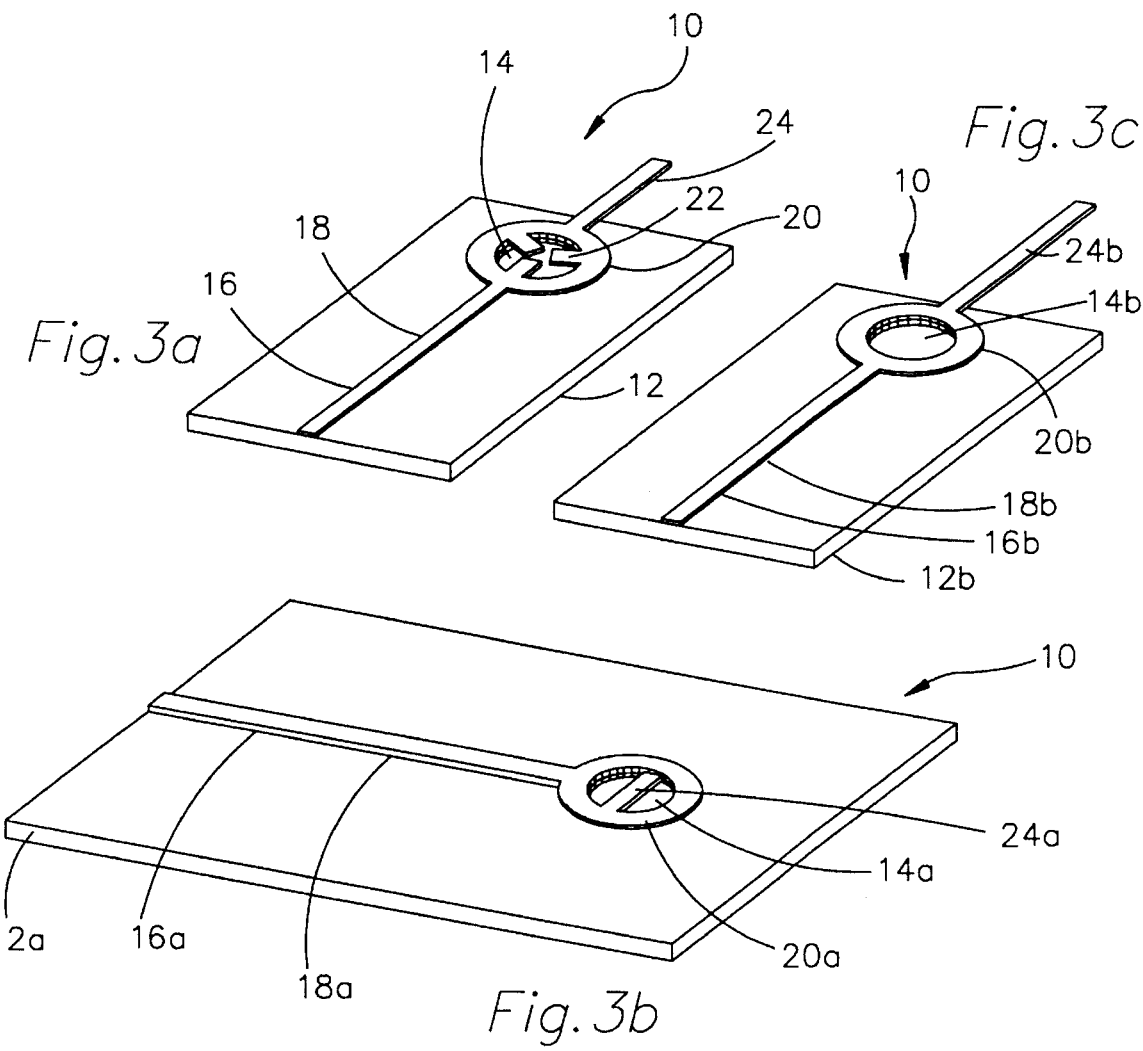

WELDABLE FLEXIBLE CIRCUIT TERMINATION FOR HIGH TEMPERATURE APPLICATIONS

BACKGROUND OF THE INVENTION

The present invention relates generally to flexible circuits and particularly to a flexible circuit termination for high temperature application. Flexible tapes have been used in the past as a lower cost and higher reliability replacement for wiring as an electronic interconnection means. Flexible tapes are routinely populated with electronic components and turned into flexible circuits, which can be die cut, folded and twisted to fit irregularly shaped hardware envelope extending the functionality of stiff glass/epoxy printed circuit board paradigms. Flexible tape and flexible circuits, like printed circuit boards, can be manufactured with multiple layers of copper conductors sandwiched between insulating layers of polyimide. The adhesives holding the layers together are typically acrylic based. Components and terminations on the flexible tapes and boards are typically made with solders through a solder wave or vapor phase process.

Industry has recently developed high temperature solid state integrated electronics and pressure sensing elements amenable to modern Silicon wafer manufacturing economies of scale. These devices are capable of operating at temperatures of 300° C. and above. High temperature applications include, for example, engine testing and oil well logging. In order to implement these high temperature product advances the packaging temperature range for sensors and transducers must be extended upward. The current low cost practical limit of packaging is approximately 185° C. A particularly weak packaging area is the electrical interconnection methodology. The transducer bodies for high temperature applications will take on various form factors in order to satisfy the requirements of different customers. The flexible nature of low cost flexible circuits offers advantages in that a populated flexible circuit could fit into differently shaped transducer bodies.

The flexible circuit prior art indicates photolithographically patterned copper, usually plated with solders of various compositions on polyimide, e.g., DUPONT KAPTON. The polyimide functions as the thin, flexible circuit "board" or substrate. Typically the copper is sandwiched between two layers of polyimide. Flexible circuit complexity can be achieved by increasing the number of copper/polyimide layers and using metal plated vias to connect one layer to another in ways similar to conventional printed circuit boards. The layers are held together by acrylic adhesives. The acrylic adhesives break down at the temperature range of interest obviating their use in these high temperature applications.

The prior art indicates through-hole or surface mounted passive and active electronic components. Through-hole components are typically wave soldered and surface mounted components are usually vapor-phase soldered. Hand soldering could be used, but is often undesirable due to the added labor. The prior art indicates thick copper laminations that can be patterned and selectively etched to form shallow three-dimensional (3-D) features useful in placing and aligning the component. The prior art also indicated two-dimensional (2D) features that can be bent to form 3-D guides or retainers for subsequently soldered component terminations.

The flexible circuit technology of the past is not acceptable for the high temperature applications described herein. The acrylic adhesive breaks down causing delamination of the flexible tape layers. In addition, the high temperature solders are not amenable to high temperature assembly processing or exhibit inherently poor reliability.

Thus a need exists for a flexible circuit termination means which has the inherent advantage of the flexible tape used at low temperature and that can be used at temperatures of 300° C. The advantages include ease of use, manufacturability, low cost and high reliability.

SUMMARY OF THE INVENTION

The present invention solves these and other needs by providing a termination for a flexible circuit for high temperature applications. The flexible circuit includes a flexible substrate and a flat conductive strip integrally bonded to the substrate. The conductive strip has a termination portion located adjacent an aperture in the substrate. The termination portion has a connection tab, with the termination portion and the connection tab lying in a plane. The termination is for connection to a conductive element end which extends through the aperture. The connection tab is formed into a shape outside the plane with the connection tab engaging the conductive element where it is secured by welding to the conductive element.

DESCRIPTION OF THE DRAWINGS

FIGS. 1a–1c show a perspective view of three alternative embodiments of a flexible circuit termination for connection to a conductive element according to the teachings of the present invention FIGS. 2a–2c show a perspective view of the alternative embodiments of FIGS. 1a–1c respectively, with the conductive element partially inserted into the termination.

FIGS. 3a–3c show a perspective view of the termination only as formed in two dimensions for the alternative embodiments of FIGS. 1a–1c respectively.

DESCRIPTION

A flexible circuit termination according to the teachings of the present invention is shown in the figures and generally designated 10. A portion of a flexible circuit is shown in FIG. 1a including a flexible substrate 12 with an aperture or hole 14. Bonded to substrate 12 is a flat conductor 16 including a transmission portion 18 and a termination 20. Termination 20 includes positioning fingers 22 and connection tab 24 which initially extends away from aperture 20. Conductive element 30 extends through aperture 20 and includes end 32. Connection tab 24 is then formed or bent, for example, using a tweezers or other device, to meet conductive element 30 and to conform tab 24 to the surface of element 30. The welding operation is performed with tab 24 held against element 30, for example, in a tweezers electrical resistance welding operation.

FIG. 2a shows a positioning feature of termination 10 with end 32 of conductive element 30 extending through aperture 14 and being positioned by positioning tabs 22. In FIG. 2a, conductive element 30 has not been fully inserted into aperture 14 and connection tab 24 has not yet been formed or bent to meet conductive element 30.

FIG. 3a shows the FIG. 1a embodiment of termination 10 as it is formed using 2-dimensional (2-D) processing.

An advantage of the termination shown in FIG. 1a through FIG. 3a is that a standard 2-D, flexible tape layout and manufacturing practice as shown in FIG. 1a is used. In addition, the present invention includes the 3-D insertion and mechanical capture and/or stabilization feature of positioning fingers 22 is built-in as a 2-D feature deployed during insertion. Also, integral strain relief is built-in as insertion hole 14 and weldable electrically conductive connecting tab 24, which allows movement of tab 24 within aperture 14. Tab 24 may be bent into a gradual sweeping curve so as to allow limited flexing without risk of tab 24 breaking.

The 2-D fabrication process can be described generally as follows. Copper is bonded to substrate 12 and chemically etched to provide the flat copper conductor 16. Conductor 16 is of a thickness that will allow later bending of tab 24 to a desired shape. Conductor 16 is then plated in a chemical plating process with a thin layer of nickel of sufficient thickness for welding. The thickness of the nickel should be thin enough so that tab 24 is bendable to a desired shape without fracturing the nickel plating.

Aperture 14 may be formed by stamping or by chemically etching. If formed by stamping, then polyimide on the backside of tab 24a, for example, may be removed by chemical etching or it could be removed at the time of manual assembly by simply cutting or scraping it away.

A first alternate embodiment of device 10 is shown in FIG. 1b, including a flexible substrate 12a with an aperture or hole 14a. Bonded to substrate 12a is a flat conductor 16a including a transmission portion 18a and a termination 20a. Termination 20a includes connection tab 24a which initially extends in a direction towards aperture 14a. Conductive element 30a extends through aperture 14a and includes end 32a.

In FIG. 2b, conductive element 30a has not been fully inserted into aperture 14a and connection tab 24a has not yet been secured to conductive element 30a.

FIG. 3b shows the FIG. 1b embodiment of termination 10 as it is formed using 2-dimensional (2-D) processing.

A second alternative embodiment of termination 10 is shown in FIG 1c including a flexible substrate 12b with an aperture or hole 14b. Bonded to substrate 12b is a flat conductor 16b including a transmission portion 18b and a termination 20b. Termination 20b includes connection tab 24b which initially extends in a direction away from aperture 14b. Conductive element 30b extends through aperture 14b and includes end 32b.

In FIG. 2c, conductive element 30b has not been fully inserted into aperture 14b and connection tab 24b has not yet been formed to meet conductive element 30b.

FIG. 3c shows the FIG. 1c alternate embodiment of termination 10 as it is formed using 2-dimensional (2-D) processing.

The present invention has application for flexible tape terminations for electronic components that include pinned connectors, packaged pinned sensors, wires and any other electronic element requiring welded electrical connection. The invention requires a high temperature flexible tape, e.g., DUPONT KAPTON, with integrally bonded plating of copper or other suitable conductive material on one or both sides. The copper or other conductor is to be bonded without employing adhesives. The copper is photolithographically patterned as desired and the patterned copper is plated with Ni or another suitable material that is both weldable and electrically conductive.

The present invention is a high temperature, i.e., $-55°$ C. to $300°$ C. flexible circuit tape with integral weldable termination for connection with on-board passive and active, analog and digital circuit components, a sensor package and a connector for interfacing to remote terminals or controllers. The present invention eliminates solder-based terminations that are susceptible to mechanical and/or conduction failure in the high temperature ranges. The failures may be due to poor wetting of high temperature solders during assembly processing, operational vibration, environment or corrosion.

The present invention has many applications. A typical application will be to form the electrical connections for sensor or transducer elements and their associated electronics which will be located in a high temperature environment. The present invention allows the flexible circuit which carries components to be bent or folded and fitted into envelopes or housings having a variety of shapes.

I claim:

1. A termination for a flexible circuit, said flexible circuit comprising a flexible substrate, a flat conductive strip integrally bonded to said substrate, said termination for connection to a conductive element having an end, said termination comprising:

said flexible substrate having an aperture therein;

said conductive strip having a termination portion located adjacent said aperture, said termination portion having a flexible connection tab, said termination portion and said connection tab fabricated in a first plane;

said conductive element end extending through said aperture;

said connection tab being formed into a shape with a portion of said connection tab engaging said conductive element and at least a portion of said shape lying outside of said first plane; and means for securing said connection tab to said conductive element by a weld, with said tab formed in said shape being sufficiently flexible to allow movement of said conductive element relative to said substrate to provide strain relief.

2. Termination of claim 1 wherein said termination portion surrounds at least a portion of said aperture and said connection tab initially extends in a direction away from said aperture.

3. Termination of claim 1 wherein said termination portion surrounds at least a portion of said aperture and said connection tab initially extends in a direction toward said aperture.

4. Termination of claim 2 wherein said termination portion surrounds at least a portion of said aperture, and said termination portion further comprises means for positioning said conductive element in said aperture, said positioning means abutting said conductive element.

5. Termination of claim 4 wherein said positioning means comprises a plurality of inwardly extending fingers.

6. Termination of claim 1 wherein said connection tab is flexible and allows movement of said conductive element relative to said substrate to provide strain relief.

7. Termination of claim 1 wherein said termination comprises a weldable metal and is suitable for operation within a temperature range of $-55$ degrees to 300 degrees C.

8. Termination of claim 7 wherein said shape comprises a gradually curving bend to allow flexing without breaking.

9. In a flexible circuit of the type having a flat conductive strip bonded to a flexible substrate, said conductive strip having a transmission portion and a termination portion lying in a first plane, said flexible circuit for electrical connection to a conductive element having an end, the improvement in a termination which comprises:

said flexible substrate having an aperture;

said termination portion located adjacent said aperture, said termination portion having a flexible connecting tab, with said conductive element end extending through said aperture, and said tab formed at least partially outside of said first plane to meet said conductive element, said tab secured to said conductive element by welding means with said tab being sufficiently flexible to allow movement of said conductive element within said aperture to provide strain relief.

10. Termination of claim 9 wherein said termination portion surrounds at least a portion of said aperture and said connection tab initially extends in a direction away from said aperture.

11. Termination of claim 10 wherein said termination portion surrounds at least a portion of said aperture and said connection tab initially extends in a direction toward said aperture.

12. Termination of claim 11 wherein said termination portion surrounds at least a portion of said aperture, and said termination portion further comprises means for positioning said conductive element in said aperture, said positioning means abutting said conductive element.

13. Termination of claim 12 wherein said positioning means comprises a plurality of inwardly extending flexible members.

14. Termination of claim 9 wherein said flexible substrate is polyimide, said flat conductive strip is nickel plated copper, and termination is suitable for operation within a temperature range of −55° to 300° C.

15. A termination for a flexible circuit, said flexible circuit comprising a flexible substrate, a flat conductive strip integrally bonded to said substrate, said termination for connection to a conductive element having an end, said termination comprising:

said flexible substrate having an aperture therein;

said conductive strip having a termination portion surrounding at least a portion of said aperture, said termination portion having a flexible connection tab, said termination portion and said connection tab fabricated in a first plane;

said conductive element end extending through said aperture;

said connection tab formed into a shape with a portion of said connection tab engaging said conductive element and at least a portion of said shape lying outside of said first plane; and means for securing said connection tab to said conductive element by welding means, with said tab being sufficiently flexible to allow movement of said conductive element relative to said substrate.

16. Termination of claim 15 wherein said flexible substrate is polyimide and said flat conductive strip is nickel plated copper.

17. Termination of claim 15 wherein said shape comprises a gradually curving bend to allow flexing without breaking.

* * * * *